United States Patent
Lee

(10) Patent No.: US 8,650,366 B2
(45) Date of Patent: Feb. 11, 2014

(54) MEMORY SYSTEM CAPABLE OF ENHANCING WRITING PROTECTION AND RELATED METHOD

(75) Inventor: Hsu-Ming Lee, Taipei Hsien (TW)

(73) Assignee: Wistron Corporation, Hsichih, New Taipei (TW)

( * ) Notice: Subject to any disclaimer, the term of this patent is extended or adjusted under 35 U.S.C. 154(b) by 262 days.

(21) Appl. No.: 12/900,489

(22) Filed: Oct. 8, 2010

(65) Prior Publication Data

US 2011/0289259 A1 Nov. 24, 2011

(30) Foreign Application Priority Data

May 19, 2010 (TW) .............................. 99115910 A

(51) Int. Cl.
*G06F 13/00* (2006.01)

(52) U.S. Cl.
USPC .......................................... 711/152; 711/100

(58) Field of Classification Search
USPC .................. 711/100, 102, 103, 147, 152, 163
See application file for complete search history.

(56) References Cited

U.S. PATENT DOCUMENTS

| | | | | |
|---|---|---|---|---|
| 5,721,869 A | * | 2/1998 | Imakawa | 711/151 |
| 6,101,584 A | * | 8/2000 | Satou et al. | 711/152 |
| 6,170,743 B1 | | 1/2001 | Okaue | |
| 6,389,519 B1 | * | 5/2002 | Thusoo et al. | 711/152 |
| 7,243,199 B2 | * | 7/2007 | Oikawa et al. | 711/163 |
| 2009/0240870 A1 | * | 9/2009 | Kinoshita | 711/103 |

FOREIGN PATENT DOCUMENTS

| | | |
|---|---|---|
| CN | 1207554 A | 2/1999 |
| CN | 101576859 A | 11/2009 |
| CN | 101645047 A | 2/2010 |

OTHER PUBLICATIONS

Office action mailed on Mar. 29, 2013 for the China application No. 201010185277.8, p. 3 line 1~18, line 20~23, line 25~28, line 30~34, line 36~39 and line 41~44, p. 4 line 1~13, line 15~33, line 35~38 and line 40~44, p. 5 line 1~13 and line 15~18 and p. 6.

Office action mailed on Aug. 26, 2013 for the China application No. 201010185277.8, p. 3 line 5~33, line 35~38 and line 40~44, p. 4 line 2~5, line 7~23 and line 25~45, p. 5 line 1~2, line 4~7, line 9~12, line 14~18, line 20~32 and line 34~37 and search report.

* cited by examiner

*Primary Examiner* — Tuan Thai
*Assistant Examiner* — Zhuo Li
(74) *Attorney, Agent, or Firm* — Winston Hsu; Scott Margo

(57) ABSTRACT

A memory system is disclosed. The memory system includes a memory device, a first control unit, and a second control unit. The memory device is utilized for storing data. The first control unit is coupled to the memory device for prohibiting a data writing process performed on the memory device during a writing protection period. The second control unit is coupled to the memory device for allowing the data writing process to be performed in the memory device according to a writing period after the writing protection period, wherein the writing period is related to the data writing process.

17 Claims, 4 Drawing Sheets

MEMORY SYSTEM CAPABLE OF ENHANCING WRITING PROTECTION AND RELATED METHOD

BACKGROUND OF THE INVENTION

1. Field of the Invention

The present invention relates to a memory system and related method, and more particularly, to a memory system capable of reducing writing error occurrences effectively to enhance writing protection and related method.

2. Description of the Prior Art

A memory device is an essential part of an electronic product. The memory device is usually utilized for storing digital data and programs to be accessed by a processor. Now, many electronic products can offer multiple functions, such as multimedia, mobile, and network functions, each of which demands more memory allocation for its application.

In general, memory is classified into two types: one time programmable memory and multi-time programmable memory. A one time programmable memory, such as a read only memory (ROM), can only be programmed once. As soon as data is written into the one time programmable memory, the one time programmable memory can not be erased and rewritten to update the data. A multi-time programmable memory, such as a flash memory, can be written, erased and rewritten many times.

Although the multi-time programmable memory provides excellent convenience of use, the multi-time programmable memory may experience error occurrences. For example, the data stored in the memory may be destroyed due to an instable power supply, instable control signal, or an unexpected power problem in the instant that power is turned on or off. In other words, part or all of data stored in the memory may be overwritten or erased wrongly, causing permanent damage. Therefore, the data stored in the memory may be corrupted or incomplete, and therefore nonfunctional. Also, if the data stored in the memory is related to system data, such as a basic input output system (BIOS) code or an embedded controller (EC) code, the computer system will fail to perform normal operations.

Therefore, for preventing the data stored in the memory device from being deleted or overwritten by unexpected data accidentally, the prior art usually adopts a writing protection scheme for the memory device by using a software or hardware design for protecting the data. For example, the prior art may set a writing protection period for the memory device by using software configuration, and utilize commands to limit any writing or erasing operation in the memory device during the writing protection period. As a result, the data stored in the memory device will not be varied if the memory device encounters the above-mentioned external factors during the writing protection period. In addition, the prior art can also use hardware design to provide the writing protection scheme. For example, the prior art uses the EC to restrict the writing process of the memory device through general purpose input output (GPIO) pins, and therefore, the memory device can avoid error writing or error erasing occurrences during the writing protection period. However, the writing protection schemes designed with software or hardware of the prior art only prevent erroneous writing to the memory device during the writing protection period. Various data writing processes may require various processing times, but an allowable data writing period is often a fixed length of time in the prior art. The memory device may also suffer the erroneous writing during the data writing period when normal data have been written to the memory device. For example, please refer to FIG. 1, which is a schematic diagram illustrating the data writing operating according to the prior art. Suppose a period X (timing point A to timing point B) and a period Z (timing point C to timing point D) are, respectively, writing protection periods, and a period Y (timing point B to timing point C) is a data writing period. This means any data writing or erasing process can be performed in the memory during the period Y. The data type and the amount of data written to the memory device during the period Y are uncertain for each data writing process, but the period Y is often an interval having a fixed length of time in the prior art. In such a situation, as shown in FIG. 1, the required processing time of a data writing operation may be shorter than the length of the period Y. Suppose a data writing process performed in the memory device begins at the timing point B, and all expected data writing operations have been finished by the timing point C'. In other words, a blank period (timing point C' to timing point C) exists, during which no data writing processing is applied. When the above-mentioned unexpected external factors occur during the blank period, the unexpected data will be written to the memory device, causing an erroneous writing situation. For example, an unstable power supply may cause an unexpected signal variation during the blank period, which the memory device will take to be a normal data signal, causing an erroneous writing situation. In short, for a memory device, an unnecessary blank time may remain in the data writing period in the prior art, which may easily lead to erroneous data writing.

SUMMARY OF THE INVENTION

It is therefore an objective of the invention to provide a memory system capable of enhancing writing protection and related method.

The present invention discloses a memory system, comprising: a memory device for storing data; a first control unit coupled to the memory device for prohibiting a data writing process performed on the memory device during a writing protection period; and a second control unit coupled to the memory device for allowing the data writing process to be performed in the memory device according to a writing period after the writing protection period, wherein the writing period is related to the data writing process.

The present invention further discloses a method for enhancing writing protection of a memory device, comprising: prohibiting a data writing process performed on the memory device during a writing protection period; and allowing the data writing process to be performed in the memory device according to a writing period after the writing protection period, wherein the writing period is related to the data writing process These and other objectives of the present invention will no doubt become obvious to those of ordinary skill in the art after reading the following detailed description of the preferred embodiment that is illustrated in the various figures and drawings.

DETAILED DESCRIPTION

Figure 1:
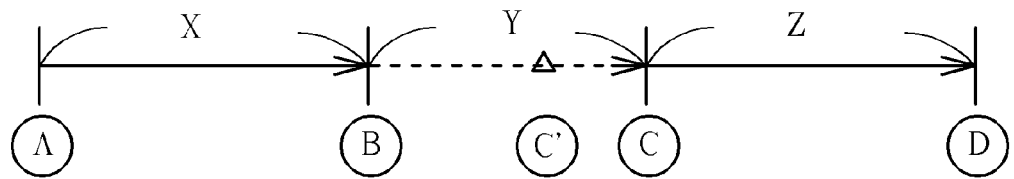
FIG. 1 is a schematic diagram illustrating the data writing operating according to the prior art.
Figure 2:
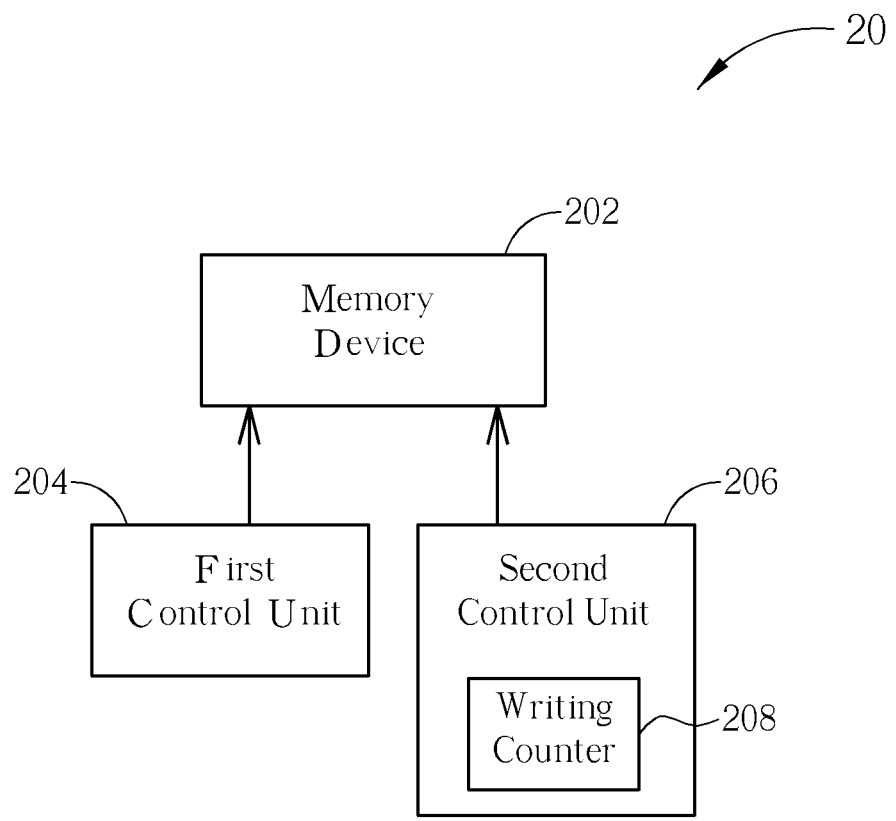
FIG. 2 is a schematic diagram of a memory system according to an embodiment of the invention.

Please refer to FIG. 2, which is a schematic diagram of a memory system 20 according to an embodiment of the invention. The memory system 20 includes a memory device 202, a first control unit 204, and a second control unit 206. The memory device 202 is utilized for storing data and programs accessible by a processor. Preferably, the memory device can be a flash memory, but this should not be a limitation of the invention. The first control unit 204 is coupled to the memory device 202 for prohibiting a data writing process performed on the memory device 202 during a writing protection period $T_{WR}$. The second control unit 206 is coupled to the memory device 202 for allowing the data writing process to be performed in the memory device 202 according to a writing period $T_W$ after the end of the writing protection period $T_{WR}$. Please note that the writing period $T_W$ is related to the data writing process. For example, length of the writing period $T_W$ depends on a processing time of the data writing process. Moreover, the writing period $T_W$ starts from the end of the writing protection period $T_{WR}$ and ends before the next writing protection period $T_{WR}$. In other words, the writing period $T_W$ is the time interval between two consecutive writing protection periods.

In detail, the first control unit 204 is capable of applying writing protection to the memory device 202 according to system demand. For example, the first control unit 204 is able to restrain any data writing process to be performed on the memory device 202 during the writing protection period $T_{WR}$ so that there is no data being written to or erased in the memory device 202 during the writing protection period $T_{WR}$. Generally, for the memory device 202, the time interval between two consecutive writing protection periods is usually a period for data writing operations or data erasing operations. In the embodiment, suppose the writing period $T_W$ begins after the end of the previous writing protection period $T_{WR}$. The second control unit 206 can control the data writing process to be performed in the memory device 202 at the beginning of each writing period $T_W$ and arrange to stop the data writing process from being performed in the memory device 202 at the end of each writing period T. Moreover, length of the writing period $T_W$ varies with each data writing process. For example, the writing period $T_W$ can be set according to the required processing time of the corresponding data writing process so that the corresponding data writing process can be finished completely during the set writing period $T_W$. Therefore, through the control operation of the second control unit 206, the memory device 202 can enter into a writing protection state in advance without waiting until the beginning of the next writing protection period $T_{WR}$. As a result, the invention can avoid any erroneous writing or erroneous erasing situations in the memory device 202 in a blank period between two consecutive writing protection periods effectively.

As can be seen, the invention can arrange the memory device 202 to enter the writing protection state immediately when the expected data have been written to the memory device according to the data writing situation with the corresponding writing period $T_W$. Therefore, data erroneous writing or erasing situation caused by unexpected external events will not occur in the memory device 202 during the blank period (i.e. from the timing point of the data writing process finishing to the timing point of the next writing protection period $T_{WR}$ beginning).

Furthermore, the second control unit 206 further includes a writing counter 208 for counting the writing period $T_W$. The writing counter 208 begins to count after the end of the previous writing protection period $T_{WR}$. At the same time, the second control unit 206 can also inform the memory device 202 to start the data writing process. The writing counter 208 can count the length of the writing period $T_W$ with the required processing time of the data writing process. The second control unit 206 is capable of stopping all data writing processes when the writing counter 208 stops counting so that the memory device 202 can enter into a writing protection state. Therefore, the data writing process can be performed in the memory device 202 without constraint of the first control unit 204 after the end of each writing protection period $T_{WR}$. The second control unit 206 can allow the data writing process according to the writing period $T_W$, and the memory device 202 can enter into a writing protection state in advance so as to reduce extra erroneous writing or erasing occurrences in the memory device 202.

Note that, the memory system 20 shown in FIG. 2 represents an exemplary embodiment of the invention and those skilled in the art can make alternations and modifications accordingly. For example, the memory device 202 can be any kind of memory which can be read or written repeatedly. The first control unit 204 can be realized in software or hardware designs. The second control unit 206 can be a memory controller, an embedded controller, or other external control devices. In addition, the above-mentioned data writing process includes a data writing process performed in the memory device 202 and a data erasing process performed in the memory device 202. Particularly, the above-mentioned data writing process includes all operating processes that vary data in the memory device 202.

Figure 3:
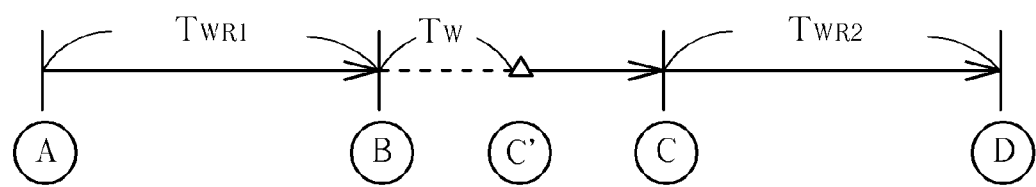
FIG. 3 is a schematic diagram of operation of the data writing process and the writing protection process according to an embodiment of the invention.

Furthermore, taking a memory device storing a BIOS code of a computer system for example, please refer to FIG. 3, which is a schematic diagram of operation of a data writing process and a writing protection process according to an embodiment of the invention. Suppose the memory device 202 is a serial peripheral interface (SPI) flash memory for storing a basic input/output system code (BIOS) code and an embedded control code of an embedded controller. As shown in FIG. 3, the first control unit 204 may put the memory device 202 into a writing protection state when data need not be written to the memory device 202, such as during the writing protection periods $T_{WR1}$ and $T_{WR2}$. In other words, through the control operation of the first control unit 204, no data writing process is performed on the memory device 202 during the writing protection periods $T_{WR1}$ and $T_{WR2}$. Moreover, the writing counter 208 is capable of starting to count at the end of the writing protection period $T_{WR}$, i.e. the timing point B, and the second control unit 206 begins to enable the corresponding data writing process performed in the memory device 202. Suppose the length of the required process time of the data writing process performed on the memory device 202 is equal to the writing period $T_W$ (from time point B to time point C'). The writing counter 208 may stop counting at the time point C', and the second control unit 206 stops the data writing process to be performed at the time point C' accordingly. In such a condition, all the expected data writing operations are finished. Therefore, the memory device 202 may enter the writing protection state in advance without waiting until the timing point C. As a result, the memory device 202 can avoid any possible erroneous writing situations during the blank period (from the timing point C' to the timing point C).

Figure 4:
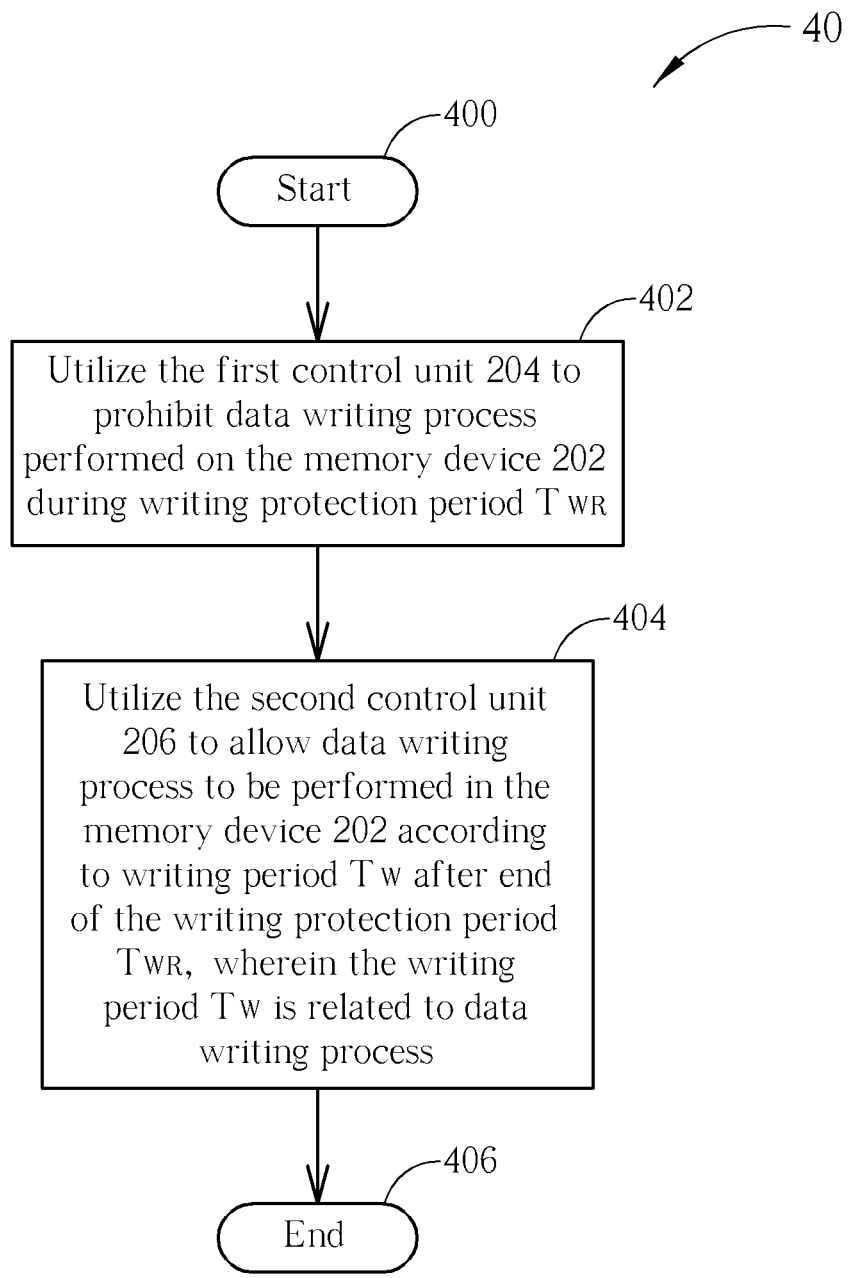
FIG. 4 is a schematic diagram of a procedure according to an embodiment of the invention.

As to the operating method of the memory system 20, please refer to FIG. 4. FIG. 4 is a schematic diagram of a procedure 40 according to an embodiment of the invention. The procedure 40 comprises the following steps:

Step 400: Start.

Step 402: Utilize the first control unit 204 to prohibit data writing process performed on the memory device 202 during writing protection period $T_{WR}$.

Step 404: Utilize the second control unit 206 to allow data writing process to be performed in the memory device 202 according to writing period $T_W$ after end of the writing protection period $T_{WR}$, wherein the writing period $T_W$ is related to data writing process.

Step 406: End.

The procedure 40 is utilized for illustrating the implementation of the memory system 20. Related variations and detailed description can be referred from the foregoing description, so as not to be narrated again herein.

In summary, the invention can arrange the memory device 202 to enter writing protection status immediately when the expected data have been written to the memory device according to data writing situation with corresponding writing period $T_W$. Therefore, data erroneous writing or erasing situations will not occur in the memory device 202 caused by unexpected external events during the blank period (i.e. from the timing point of the data writing process finishing to the timing point of the next writing protection period $T_{WR}$ beginning).

Those skilled in the art will readily observe that numerous modifications and alterations of the device and method may be made while retaining the teachings of the invention.

What is claimed is:

1. A memory system comprising:
a memory device for storing data;
a first control unit coupled to the memory device for prohibiting a data writing process performed on the memory device during a writing protection period; and
a second control unit coupled to the memory device for allowing the data writing process to be performed in the memory device during a writing period and stopping the data writing process from being performed in the memory device during the period between the end of the writing period and the beginning of the next writing protection period, wherein the end of the writing period is before the next writing protection period, and a length of the writing period is equal to the required processing time of the corresponding data writing process.

2. The memory system of claim 1, wherein the writing period starts from the end of the previous writing protection period and ends before the next writing protection period.

3. The memory system of claim 1, wherein length of the writing period depends on a processing time of the data writing process.

4. The memory system of claim 1, wherein the second control unit enables the data writing process to be performed in the memory device at the beginning of the writing period, and stops the data writing process from being performed in the memory device at the end of the writing period.

5. The memory system of claim 1, wherein the second control unit further comprises a writing counter for counting the writing period according to a processing time of the data writing process.

6. The memory system of claim 5, wherein the writing counter starts to count the writing period at the end of the writing protection period for the second control unit to enable the data writing process performed in the memory device accordingly, and the second control unit stops the data writing process from being performed in the memory device when the writing counter stops counting the writing period.

7. The memory system of claim 5, wherein the writing counter stops counting the writing period before the next writing protection period begins, and the second control unit stops the data writing process from being performed in the memory device accordingly.

8. The memory system of claim 1, wherein the data writing process further comprises a data erasing process.

9. The memory system of claim 1, wherein the memory device is a flash memory.

10. A method for enhancing writing protection of a memory device, the method comprising:
prohibiting a data writing process performed on the memory device during a writing protection period; and
allowing the data writing process to be performed in the memory device during a writing period and stopping the data writing process from being performed in the memory device during the period between the end of the writing period and the beginning of the next writing protection period, wherein the end of the writing period is before the next writing protection period, and a length of the writing period is equal to the required processing time of the corresponding data writing process.

11. The method of claim 10, wherein the writing period starts from the end of the previous writing protection period and ends before the next writing protection period.

12. The method of claim 10, wherein length of the writing period depends on a processing time of the data writing process.

13. The method of claim 10, wherein the step of allowing the data writing process to be performed in the memory device during the writing period is enabling the data writing process to be performed in the memory device at the beginning of the writing period, and stopping the data writing process from being performed in the memory device at the end of the writing period.

14. The method of claim 10, wherein the step of allowing the data writing process to be performed in the memory device during the writing period is starting to count the writing period at the end of the writing protection period for the data writing process to be enabled accordingly, and stopping the data writing process from being performed in the memory device when stopping counting the writing period.

15. The method of claim 14, wherein the step of stopping the data writing process from being performed in the memory device when stopping counting the writing period is stopping counting the writing period before the next writing protection period begins and stopping the data writing process from being performed in the memory device accordingly.

16. The method of claim 10, wherein the memory device is a flash memory.

17. The method of claim 10, wherein the data writing process further comprises a data erasing process.

* * * * *